(12) United States Patent
Kent et al.

(10) Patent No.: US 6,980,469 B2
(45) Date of Patent: Dec. 27, 2005

(54) HIGH SPEED LOW POWER MAGNETIC DEVICES BASED ON CURRENT INDUCED SPIN-MOMENTUM TRANSFER

(75) Inventors: Andrew Kent, New York, NY (US); Enrique Gonzalez Garcia, New York, NY (US); Barbaros Özyilmaz, Brooklyn, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 10/643,762

(22) Filed: Aug. 19, 2003

(65) Prior Publication Data

US 2005/0041462 A1 Feb. 24, 2005

(51) Int. Cl.$^7$ .............................................. G11C 11/14
(52) U.S. Cl. ..................... 365/171; 365/158; 365/173; 365/225.5; 365/97; 365/66; 257/421
(58) Field of Search ................................ 365/171, 173, 365/158, 97, 225.5, 66; 257/421

(56) References Cited

U.S. PATENT DOCUMENTS

| | | | |
|---|---|---|---|
| 5,695,864 A | 12/1997 | Slonczewski | 428/212 |
| 5,856,897 A * | 1/1999 | Mauri | 360/314 |
| 5,896,252 A * | 4/1999 | Kanai | 360/324.12 |
| 5,966,323 A * | 10/1999 | Chen et al. | 365/158 |
| 6,134,138 A * | 10/2000 | Lu et al. | 365/158 |
| 6,154,349 A * | 11/2000 | Kanai et al. | 360/324.12 |
| 6,256,223 B1 | 7/2001 | Sun | 365/171 |
| 6,522,137 B1 * | 2/2003 | Sun et al. | 324/303 |
| 6,532,164 B2 | 3/2003 | Redon et al. | |
| 6,538,918 B2 * | 3/2003 | Swanson et al. | 365/158 |
| 6,603,677 B2 | 8/2003 | Redon et al. | |
| 6,654,278 B1 * | 11/2003 | Engel et al. | 365/158 |

(Continued)

FOREIGN PATENT DOCUMENTS

JP 02001195878 A * 7/2001 ........... G11C 11/14

OTHER PUBLICATIONS

R.H. Koch, et al. Physical Review Letters, vol. 84, No. 23, Jun. 2000 *Thermally Assisted Magnetization Reversal in Submicron-Sized Magnetic Thin Films*.

(Continued)

*Primary Examiner*—Viet Q. Nguyen
(74) *Attorney, Agent, or Firm*—Darby & Darby

(57) ABSTRACT

The present invention generally relates to the field of magnetic devices for memory cells that can serve as non-volatile memory. More specifically, the present invention describes a high speed and low power method by which a spin polarized electrical current can be used to control and switch the magnetization direction of a magnetic region in such a device. The magnetic device comprises a pinned magnetic layer with a fixed magnetization direction, a free magnetic layer with a free magnetization direction, and a read-out magnetic layer with a fixed magnetization direction. The pinned magnetic layer and the free magnetic layer are separated by a non-magnetic layer, and the free magnetic layer and the read-out magnetic layer are separated by another non-magnetic layer. The magnetization directions of the pinned and free layers generally do not point along the same axis. The non-magnetic layers minimize the magnetic interaction between the magnetic layers. A current is applied to the device to induce a torque that alters the magnetic state of the device so that it can act as a magnetic memory for writing information. The resistance, which depends on the magnetic state of the device, is measured to thereby read out the information stored in the device.

35 Claims, 10 Drawing Sheets

U.S. PATENT DOCUMENTS

| | | | |
|---|---|---|---|
| 6,744,086 B2 * | 6/2004 | Daughton et al. | 257/295 |
| 6,750,491 B2 * | 6/2004 | Sharma et al. | 257/295 |
| 6,812,537 B2 * | 11/2004 | Okazawa et al. | 257/421 |
| 2003/0218903 A1 * | 11/2003 | Luo | 365/158 |
| 2004/0130936 A1 * | 7/2004 | Nguyen et al. | 365/158 |

OTHER PUBLICATIONS

Lee et al., Analytical investigation of spin-transfer dynamics using a perpendicular-to-plane polarizer,, *Applied Physics Letters* 86, pp. 022505-022505-3 2005.

* cited by examiner

Two current pulses

One short current pulse

Demagnetizing Field

Demagnetizing Field

Demagnetizing Field

Two current pulses

HIGH SPEED LOW POWER MAGNETIC DEVICES BASED ON CURRENT INDUCED SPIN-MOMENTUM TRANSFER

FIELD OF THE INVENTION

The present invention generally relates to magnetic devices used in memory and information processing applications, such as giant magnetoresistance (GMR) devices. More specifically, the present invention describes a high speed and low power method by which a spin polarized electrical current can be used to control and switch the direction of magnetization of a magnetic region in such a device.

BACKGROUND OF THE INVENTION

Magnetic devices that use a flow of spin-polarized electrons are of interest for magnetic memory and information processing applications. Such a device generally includes at least two ferromagnetic electrodes that are separated by a non-magnetic material, such as a metal or insulator. The thicknesses of the electrodes are typically in the range of 1 nm to 50 nm. If the non-magnetic material is a metal, then this type of device is known as a giant magnetoresistance or spin-valve device. The resistance of the device depends on the relative magnetization orientation of the magnetic electrodes, such as whether they are oriented parallel or anti-parallel (i.e., the magnetizations lie on parallel lines but point in opposite directions). One electrode typically has its magnetization pinned, i.e., it has a higher coercivity than the other electrode and requires larger magnetic fields or spin-polarized currents to change the orientation of its magnetization. The second layer is known as the free electrode and its magnetization direction can be changed relative to the former. Information can be stored in the orientation of this second layer. For example, "1" or "0" can be represented by anti-parallel alignment of the layers and "0" or "1" by parallel alignment. The device resistance will be different for these two states and thus the device resistance can be used to distinguish "1" from "0." An important feature of such a device is that it is a non-volatile memory, since the device maintains the information even when the power is off, like a magnetic hard drive. The magnet electrodes can be sub-micron in lateral size and the magnetization direction can still be stable with respect to thermal fluctuations.

In conventional magnetic random access memory (MRAM) designs, magnetic fields are used to switch the magnetization direction of the free electrode. These magnetic fields are produced using current carrying wires near the magnetic electrodes. The wires must be small in cross-section because memory devices consist of dense arrays of MRAM cells. As the magnetic fields from the wires generate long-range magnetic fields (magnetic fields decay only as the inverse of the distance from the center of the wire) there will be cross-talk between elements of the arrays, and one device will experience the magnetic fields from the other devices. This cross-talk will limit the density of the memory and/or cause errors in memory operations. Further, the magnetic fields generated by such wires are limited to about 0.1 Tesla at the position of the electrodes, which leads to slow device operation. Importantly, conventional memory designs also use stochastic (random) processes or fluctuating fields to initiate the switching events, which is inherently slow and unreliable (see, for example, R. H. Koch et al., Phys. Rev. Lett. 84, 5419 (2000)).

In U.S. Pat. No. 5,695,864 and several other publications (e.g., J. Slonckewski, Journal of Magnetism and Magnetic Materials 159, L1 (1996)), John Slonckewski described a mechanism by which a spin-polarized current can be used to directly change the magnetic orientation of a magnetic electrode. In the proposed mechanism, the spin angular momentum of the flowing electrons interacts directly with the background magnetization of a magnetic region. The moving electrons transfer a portion of their spin-angular momentum to the background magnetization and produce a torque on the magnetization in this region. This torque can alter the direction of magnetization of this region and switch its magnetization direction. Further, this interaction is local, since it only acts on regions through which the current flows. However, the proposed mechanism was purely theoretical.

Slonckewski's patent describes MRAM devices that use spin-momentum transfer for magnetic switching. However, the proposed devices are slow and rely on fluctuating magnetic fields and stochastic processes to initiate magnetization switching. Further, large current densities are needed to switch the devices. In describing the preferred embodiment of his "latch or logic gate," Slonckewski states " . . . the preferred axes of the 3 magnets F1, F2, and F3 are all "vertical" (i.e., in the same direction or orientation) as discussed above. Other orientations can serve as long as they are parallel to the same axis." As we describe below, our device makes use of layer magnetizations that are not parallel to the same axis, to great advantage in speed, reliability, and power consumption.

U.S. Pat. No. 6,256,223 to Jonathan Sun also describes devices that use current-induced magnetic fields and demonstrates in experiment the operation of such devices. However, the devices proposed were unreliable, as there was little consistency with regard to device characteristics. Further, the estimated time scale for magnetic switching was 50 nsec for operation at large current densities.

Devices are needed that exhibit high speed and reliable operation under the action of a spin-polarized current. This includes devices that operate with lower power and have lower threshold currents for switching the magnetization orientation.

SUMMARY OF THE INVENTION

In view of the limitations associated with conventional designs of devices that use spin-momentum transfer, an object of the present invention is to provide a structure that is optimal for a magnetic memory or magnetic information processing device.

It is another object of the present invention to produce a magnetic device that has advantages in terms of speed of operation.

It is a further object of the present invention to produce a magnetic device that has advantages in terms of reliability.

It is a further object of the present invention to produce a magnetic device that requires lower power to operate.

These and additional objects of the invention are accomplished by a device that employs magnetic layers in which the layer magnetization directions do not lie along the same axis. For instance in one embodiment, two magnetic regions have magnetizations that are orthogonal.

The invention is a magnetic device comprised of ferromagnetic and non-magnetic layers through which current can flow. The magnetic device is comprised of a ferromagnetic layer with a fixed magnetization direction and another ferromagnetic layer separated from the first by a non-magnetic region that has a magnetization that is free to rotate in response to applied currents. A third ferromagnetic layer, again, separated from the others by a non-magnetic layer, has a fixed magnetization direction and can be employed to readout the magnetization direction of the free ferromagnetic layer. The magnetization directions of the ferromagnetic layers are not all along the same axis. In one of the preferred embodiments, the first fixed ferromagnetic layer's magnetization direction is perpendicular to the plane of the layer, while the free ferromagnetic layer's magnetization is in the plane of the layer. As described above, a current flow between the layers transfers spin-angular momentum from the fixed magnetization layer to the free magnetization layer and produces a torque on the magnetization of the free layer. The torque is proportional to the vector triple product of the magnetization direction of the fixed and free layer, with a factor of proportionality that depends on the current and the spin polarization of the current. A large torque is produced when the magnetization directions of the fixed and free layers are orthogonal.

This large torque acting on the magnetization direction of the free magnetic layer causes the magnetization of the free magnetic layer to rotate out of the plane of the layer. Since the thickness of the free magnetic layer is less than the width and length dimensions, the rotation of the magnetization of the free magnetic layer out of the plane of the layer generates a large magnetic field, a 'demagnetizing' field, which is perpendicular to the plane of the layer.

This demagnetizing field forces the magnetization vector of the free magnetic layer to precess, i.e., for the magnetization direction to rotate around the direction of the demagnetization magnetic field. The demagnetizing field also determines the rate of precession. A large demagnetizing field results in a high precession rate, which is an optimal condition for fast magnetic switching. An advantage of this magnetic device is that random fluctuating forces or fields are not necessary to initiate or control the magnetic response of the layers.

BRIEF DESCRIPTION OF THE DRAWINGS

The foregoing and other features of the present invention will be more readily apparent from the following detailed description and drawings of the illustrative embodiments of the invention wherein like reference numbers refer to similar elements throughout the views and in which.

DETAILED DESCRIPTION OF THE EMBODIMENTS

Structure of a Basic Magnetic Device

Figure 1:
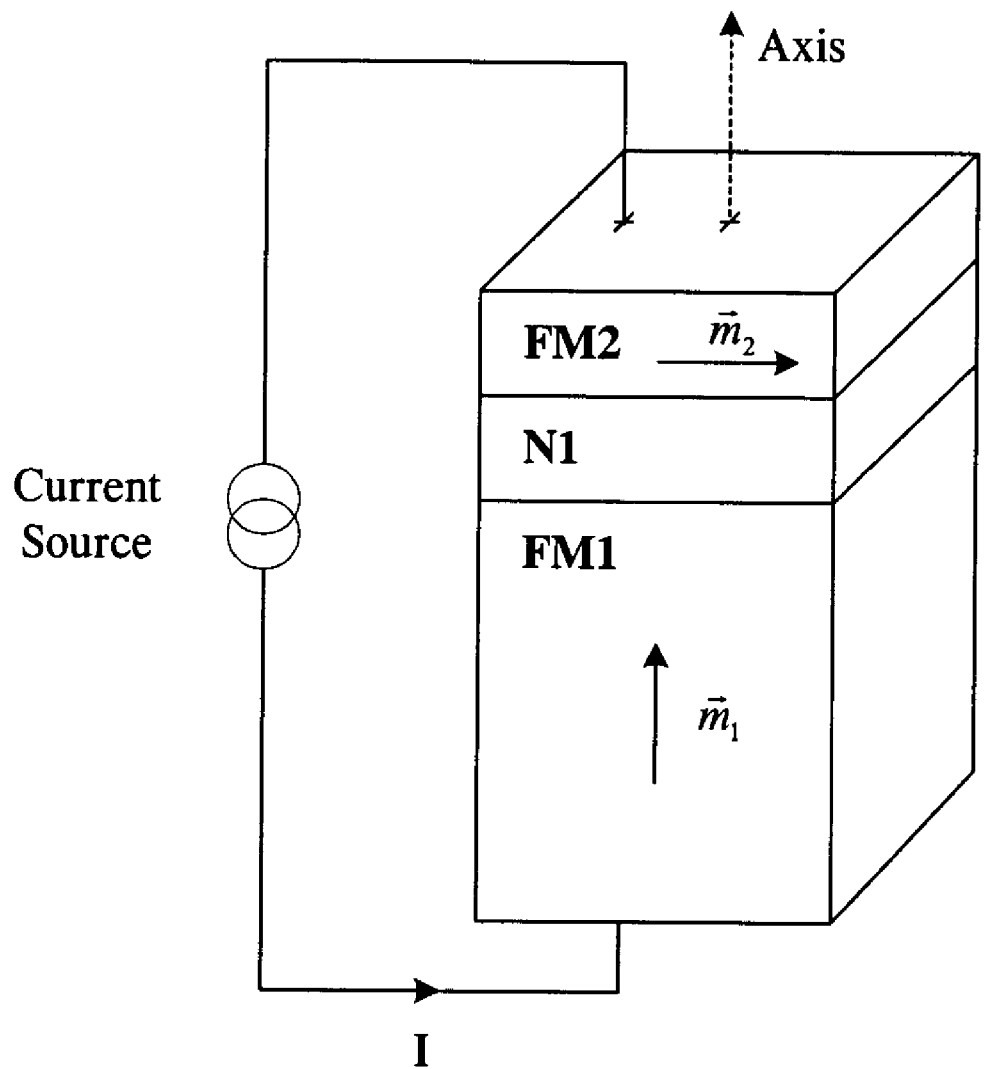
FIG. 1 is an illustration of a magnetic device according to the present invention.

To illustrate the basic concept, FIG. 1 shows a multilayered, pillar-shaped magnetic device comprising a pinned magnetic layer FM1 with a fixed magnetization direction and a free magnetic layer FM2 with a free magnetization direction. $\vec{m}_1$ is the magnetization vector of the pinned magnetic layer FM1, and $\vec{m}_2$ is the magnetization vector of the free magnetic layer FM2. The pinned magnetic layer FM1 acts as a source of spin angular momentum.

The pinned magnetic layer FM1 and the free magnetic layer FM2 are separated by a first non-magnetic layer N1 that spatially separates the two layers FM1 and FM2 such that their mutual magnetic interaction is minimized. The pillar-shaped magnetic device is typically sized in nanometers, e.g., it may be less than approximately 200 nm laterally.

The free magnetic layer FM2 is essentially a magnetic thin film element imbedded in a pillar-shaped magnetic device with two additional layers—the pinned magnetic layer FM1 and the non-magnetic layer N1. The layer thicknesses are typically approximately 1 nm to 50 nm.

These pillar-shaped magnetic devices can be fabricated in a stacked sequence of layers by many different means, including sputtering, thermal and electron-beam evaporation through a sub-micron stencil mask. These magnetic devices can also be fabricated in a stack sequence using sputtering, thermal and electron-beam evaporation to form a multilayered film followed by a subtractive nanofabrication process that removes materials to leave the pillar-shaped magnetic device on a substrate surface, such as that of a silicon of other semiconducting or insulating wafer.

Materials for the ferromagnetic layers include (but are not limited to) Fe, Co, Ni, and alloys of these elements, such as $Ni_{1-x}Fe_x$; alloys of these ferromagnetic metals with non-magnetic metals, such as Cu, Pd, Pt, NiMnSb, at compositions in which the materials are ferromagnetically ordered at room temperature; conducting materials; and conducting magnetic oxides such as $CrO_2$ and $Fe_3O_4$. For the nonmagnetic layers, materials include (but are not limited to) Cu, Cr, Au, Ag, and Al. The main requirement for the non-magnetic layer is the absence of scattering of the electron spin-direction on a short length scale, which is less than about the layer thickness.

An electric current source is connected to the pinned magnetic layer FM1 and the free magnetic layer FM2 so that an electric current I can traverse the pillar device.

Method of Magnetic Switching

An electric current I is applied to the pillar-shaped magnetic device so that the current I flows through the various layers of the device, from the pinned magnetic layer FM1 to the first non-magnetic layer N1 to the free magnetic layer FM2. The applied current I results in a transfer of angular momentum from the pinned magnetic layer FM1 to the free magnetic layer FM2. As stated above, a transfer of angular momentum from one magnetic region to another can produce a torque.

Figure 2A:
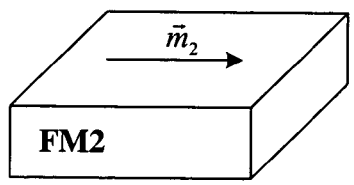
FIGS. 2A–2E are illustrations of the free magnetic layer showing the magnetization vector and the demagnetizing field of the electronic device of FIG. 1 during the application of pulses of current as illustrated in FIG. 3A.

FIGS. 2A–2E show steps in the method of magnetic switching using the magnetic device shown in FIG. 1 and for convenience, FIGS. 2A–2E only show the free magnetic layer FM2 and the magnetization vector $\vec{m}_2$ of the free magnetic layer FM2. FIG. 2A shows the initial state of the free magnetic layer FM2 before the current I is applied.

Figure 2B:
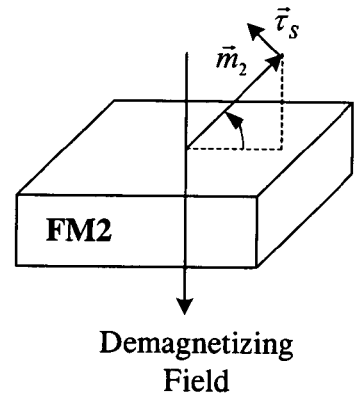
Figure 2C:
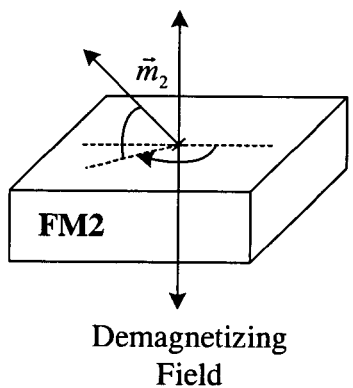
Figure 2D:
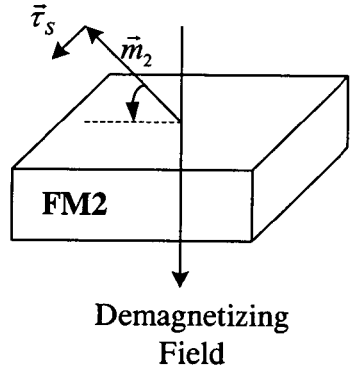
Figure 3A:
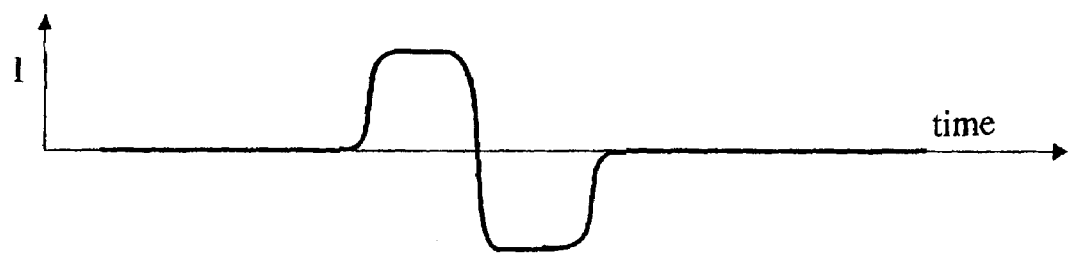
FIG. 3A is an illustration of a current waveform that may be applied to the magnetic device.
Figure 3B:
FIG. 3B is an illustration of an alternate current waveform that may be applied to the magnetic device.

As shown in FIGS. 2B–2D, applying a current I, which can be of a form as shown in FIGS. 3A and 3B, results in the transfer of angular momentum from the pinned magnetic layer FM1 to the free magnetic layer FM2. This transfer of angular momentum from the pinned magnetic layer FM1 to the free magnetic layer FM2 produces a torque $\vec{\tau}_s$ on the magnetic moment of the free magnetic layer FM2.

The torque $\vec{\tau}_s$ per unit magnetization of the free layer is proportional to the vector triple product $a_j\hat{m}_2 \times (\hat{m}_2 \times \hat{m}_1)$, where $\hat{m}_2$ is a unit vector in the direction of the magnetic moment of the free magnetic layer FM2 and $\hat{m}_1$ is a unit vector in the direction of the magnetic moment of the pinned magnetic layer FM1. The prefactor, $a_j$, depends on the current I, the spin-polarization P of the current I, and the cosine of the angle between the free and pinned magnetic layers, $\cos(\theta)$, such that $a_j = \hbar Ig(P,\cos(\theta))/(mMV)$. $\hbar$ is the reduced Planck's constant, g is a function of the spin-polarization P and $\cos(\theta)$, M is the magnetization density of the free layer, m is the mass of the electron, and V is the volume of the free layer (see, J. Slonczewski, Journal of Magnetism and Magnetic Materials 159, L1 (1996)). Thus, a large torque $\vec{\tau}_s$ is produced when the magnetic moments of the pinned magnetic layer FM1 and the free magnetic layer FM2 are perpendicular.

This torque $\vec{\tau}_s$, which acts on the magnetic moment of the free magnetic layer FM2, causes the magnetization of the free magnetic layer FM2 to rotate out of the plane of the layer. Since the thickness of the free magnetic layer FM2 is less than the width and length dimensions of the free magnetic layer FM2, the rotation of the magnetization vector $\vec{m}_2$ of the free magnetic layer FM2 out of the plane of the layer generates a large magnetic field, a 'demagnetizing' field, which is perpendicular to the plane of the layer.

This demagnetizing field forces the magnetization vector $\vec{m}_2$ of the free magnetic layer FM2 to precess, i.e., to move such that the magnetization direction rotates about the magnetic field axis. The demagnetizing field also determines the rate of precession. A large demagnetizing field results in an extremely high precession rate, which is an optimal condition for fast magnetic switching.

Thus, in an optimal configuration of the magnetic memory device for fast magnetic switching, the magnetic moment of the pinned magnetic layer FM1 is perpendicular to the plane of the free magnetic layer FM2, and the magnetic moment of the free magnetic layer FM2 is perpendicular to the axis of the pillar of thin layers and lies in the plane of the free magnetic layer FM2.

Figure 2E:
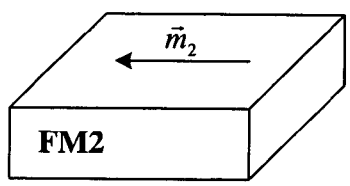

FIG. 2E shows the free magnetic layer FM2 after the magnetic switching process is completed. As shown in FIGS. 2A and 2E, the magnetic switching process causes the magnetization vector $\vec{m}_2$ of the free magnetic layer FM2 to switch by reversing direction by rotating 180°.

FIGS. 3A and 3B show two different forms of current input that may be applied to the magnetic device. The current input shown in FIG. 3A is comprised of two current pulses of short duration, a first positive current pulse followed by a second negative current pulse. This form of current input results in writing a '1' or a '0'. Alternatively, the first current pulse can be negative and the second current pulse can be positive, as long as the two current pulses are of opposite polarity. In both cases, the state of the magnetic bit will be changed from '1' to '0' or '0' to '1' (i.e., the final state will be the complement of the initial state of the bit). The current input shown in FIG. 3A is used in the method of magnetic switching described above and shown in FIGS. 2A–2E. Using a current input formed of two current pulses results in a faster magnetic switching process.

The first current pulse starts the precession of the magnetization vector $\vec{m}_2$ of the free magnetic layer FM2. After the completion of the first current pulse, the second current pulse is applied to stop the precession at a desired state.

The second current pulse is not essential to the operation of the device, but it enables higher speed switching. For example, the current input shown in FIG. 3B is comprised of a single positive current pulse. Alternatively, a single negative current pulse may also be applied to the magnetic device. Simulations show that many different types of current pulses switch FM2. Therefore device operation is certainly not limited to the current pulses shown in FIG. 3.

Structure of a Memory Cell

Figure 4:
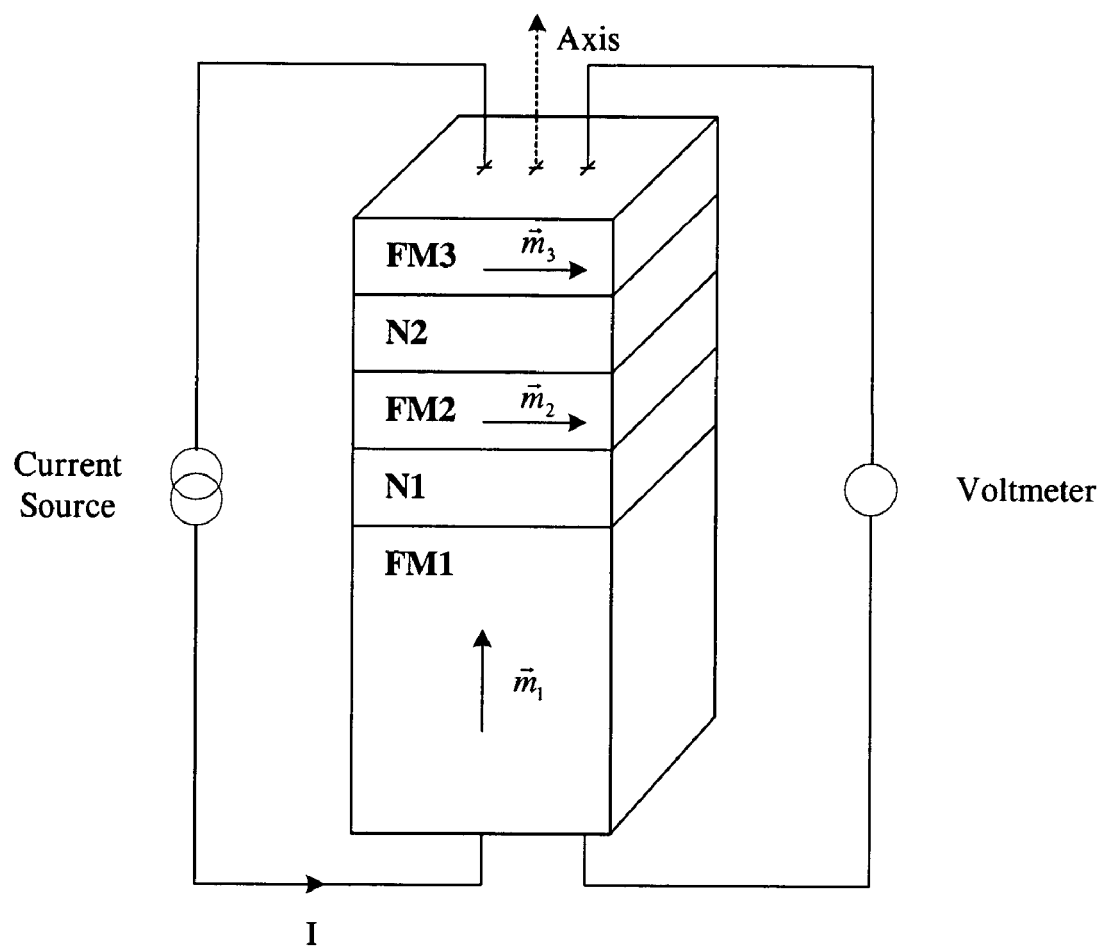
FIG. 4 is an illustration of a memory cell according to one embodiment of the present invention.

The magnetic device described above can be incorporated into a memory cell for inclusion into arrays of memory cells to make up a magnetic memory. According to one embodiment as shown in FIG. 4, the magnetic device of the present invention, when implemented as a memory cell, is a multi-layered, pillar-shaped device having a pinned magnetic layer FM1 with a fixed magnetization direction, a free magnetic layer FM2 with a free magnetization direction, and a read-out magnetic layer FM3 with a fixed magnetization direction. $\vec{m}_1$ is the magnetization vector of the pinned magnetic layer FM1, $\vec{m}_2$ is the magnetization vector of the free magnetic layer FM2, and $\vec{m}_3$ is the magnetization vector of the read-out magnetic layer FM3.

The pinned magnetic layer FM1 and the free magnetic layer FM2 are separated by a first non-magnetic layer N1 that spatially separates the two layers FM1 and FM2 such that their mutual magnetic interaction is minimized. The free magnetic layer FM2 and the read-out magnetic layer FM3 are separated by a second non-magnetic layer N2 that spatially separates the two layers FM2 and FM3 such that their mutual magnetic interaction is minimized. The pillar-shaped magnetic device is typically sized in nanometers, e.g., it may be less than approximately 200 nm.

An electric current source is connected to the pinned magnetic layer FM1 and the read-out magnetic layer FM3 so that an electric current I can traverse the pillar device. A voltmeter is connected to the pinned magnetic layer FM1 and the read-out magnetic layer FM3 so that the resistance of the magnetic device can be measured to thereby read the logical contents of the memory cell.

Method For Writing Information

The magnetic switching process is used when information is written into a memory cell. To store a logical bit of information in a memory cell, the magnetization direction of the magnetization vector inside the memory cell is set in one of two possible orientations to code the logical values of '0' and '1'. This magnetic device, when implemented as a memory cell, uses the method of magnetic switching described previously in order to store bits of information. Current pulses are applied to change the logical value in the magnetic device. The magnetic memory device described above and shown in FIG. 4 stores one bit of information since the free magnetic layer FM2 has a single magnetization vector $\vec{m}_2$ with two stable magnetic states.

An electric current I is applied to the pillar-shaped magnetic memory device so that the current I flows through the various layers of the magnetic memory device, from the pinned magnetic layer FM1 to the read-out magnetic layer FM3. The applied current I results in a transfer of angular momentum from the pinned magnetic layer FM1 to the free magnetic layer FM2.

Figure 5A:
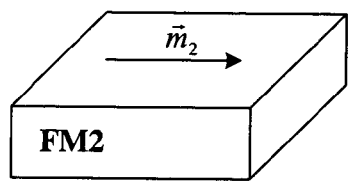
FIGS. 5A–5E are illustrations of the free magnetic layer showing the magnetization vector and the demagnetizing field of the memory cell of FIG. 4.

FIGS. 5A–5E show steps in the method of writing information using the magnetic memory device shown in FIG. 4 and for convenience, FIGS. 5A–5E only show the free magnetic layer FM2 and the magnetization vector $\vec{m}_2$ of the free magnetic layer FM2. FIG. 5A shows the initial state of the free magnetic layer FM2 before the current I is applied.

Figure 5B:
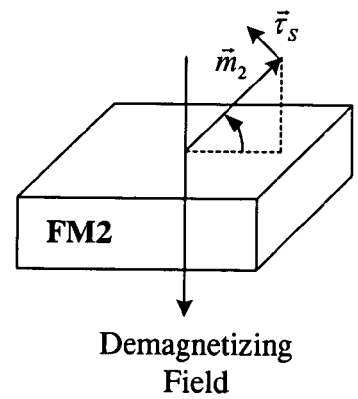
Figure 5C:
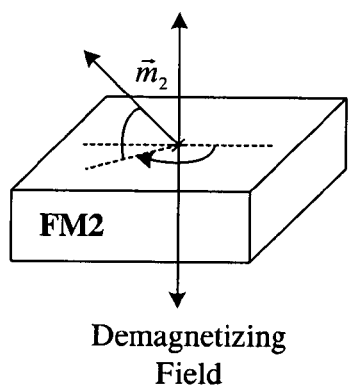
Figure 5D:
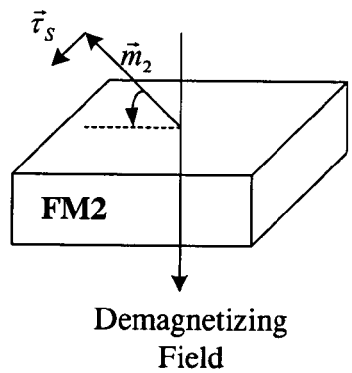

As shown in FIGS. 5B–5D, applying a current I, which can be of a form as shown in FIGS. 3A and 3B, results in the transfer of angular momentum from the pinned magnetic layer FM1 to the free magnetic layer FM2. FIGS. 2A–2E and 5A–5E show the change in the orientation of the magnetization vector $\vec{m}_2$ of the free magnetic layer FM2 as a result of applying the current to the magnetic device.

Figure 6A:
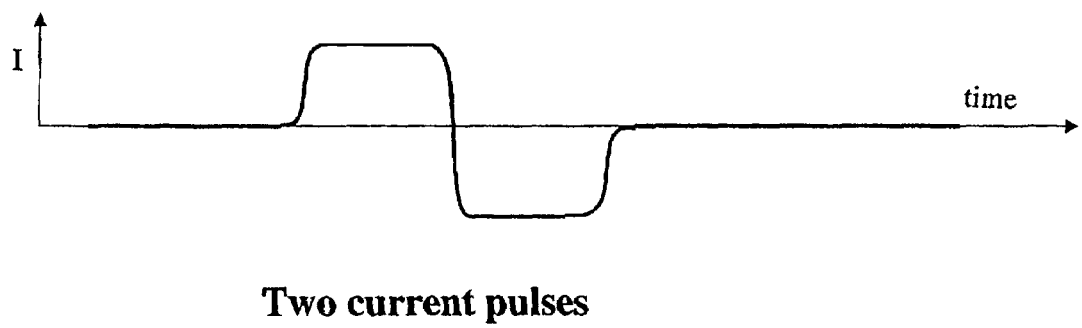
FIG. 6A is an illustration of a current waveform that may be applied to the memory cell of FIG. 4 during a write operation.

FIG. 6A shows a form of the current input that is applied to the magnetic memory device shown in FIG. 4. The current input of FIG. 6A includes two current pulses of short duration, a first positive current pulse followed by a second negative current pulse, which results in writing a '1' or a '0'. Alternatively, the first current pulse can be negative and the second current pulse can be positive, as long as the two current pulses are of opposite polarity. In both cases, the state of the magnetic bit will be changed from '1' to '0' or '0' to '1' (i.e., the final state will be the complement of the initial state of the bit).

The first current pulse starts the precession of the magnetization vector $\vec{m}_2$ of the free magnetic layer FM2. After the completion of the first current pulse, the second current pulse is applied to stop the precession at a desired state. For this embodiment of the magnetic memory device of the present invention, the precession is stopped when 180° rotation of the magnetization vector $\vec{m}_2$ of the free magnetic layer FM2 is achieved.

Figure 5E:
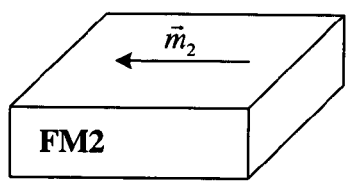
Figure 6B:
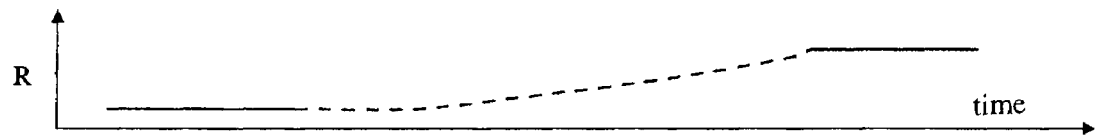
FIG. 6B is an illustration of a resistance measured from the memory cell during a read-out operation before and after the current pulse shown in FIG. 6A is applied.
Figure 7:
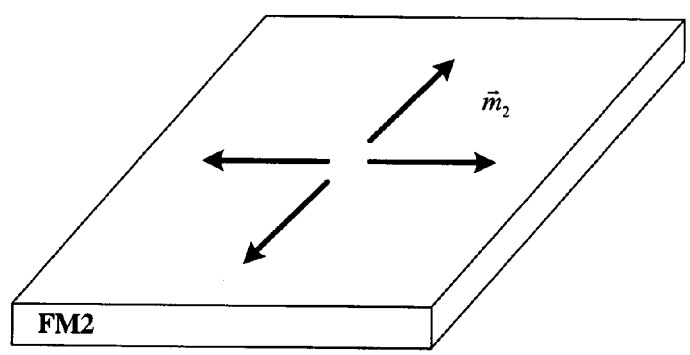
FIG. 7 is an illustration of the free magnetic layer of a 4-state memory cell.

FIG. 6B shows an example of the corresponding resistance of the device as measured by the voltmeter connected to the magnetic memory device shown in FIG. 4 with a small current applied, i.e., a current intensity much less than that used in the current pulses. The resistance increases after the current pulses of FIG. 6A are applied to the device. At the initial state shown in FIG. 5A (before the first positive current pulse), the resistance is at a constant low value. At the final state shown in FIG. 5E, the resistance is at a constant high value.

Thus, the states shown in FIGS. 5A and 5E correspond to a logical value of "0" in the initial state and a logical value of "1" in the final state, respectively. The magnetization vector $\vec{m}_2$ of the free magnetic layer FM2 in the final state shown in FIG. 5E is in the opposite direction than the magnetization vector $\vec{m}_2$ of the free magnetic layer FM2 in the initial state shown in FIG. 5A.

The necessary amplitude of the current pulses can be estimated by numerical modeling using the equations of micromagnetics, the Landau-Lifzshitz Gilbert equations including the spin-transfer torque discussed earlier (see, for example, B. Oezyilmaz et al., Phys. Rev. Lett. 91, 067203 (2003)). For a free layer comprised of Co with a magnetization density of M=1400 emu/cm$^3$, a Gilbert damping parameter α of 0.01, a spin-polarization of the current P of 0.4, and an in-plane uniaxial anisotropy field of 1000 kOe. (In this case, the in-plane uniaxial anisotropy constant K is K=7×10$^5$erg/cm$^3$.) For the purposes of this estimation, the Co free layer is 3 nm thick and has lateral dimensions of 60 nm by 60 nm. We find that a current pulse of amplitude of 5 mA is more than sufficient to switch the layer. The current necessary to switch the device is reduced by decreasing the size of the Co free layer; increasing the spin-polarization of the current, for example, by using a pinned layer with a higher degree of spin-polarization; and decreasing the in-plane anisotropy or decreasing the Gilbert damping. For this current amplitude, a 35 psec pulse is sufficient to switch the device.

With a device resistance of 5 Ohms, the energy dissipation is 5×10$^{-15}$ J. This energy dissipation value can be compared to the energy needed to switch a magnetic device with a spin-polarized current when the pinned layer and the free layer magnetizations are initially aligned along the same axis. Recent experiments show that this requires a current of approximately 10 mA applied for approximately 10 ns in a device with a resistance of 5 Ohms (see, R. Koch et al., preprint to be published in Phys. Rev. Lett.). The energy dissipated is thus 5×10$^{-12}$ J. Thus, in comparison, the power requirement for our device is quite small. Further, because the pulse is on only very briefly, in spite of the large current densities, 1 A/$\mu$m$^2$, no electromigration is expected. Further, we have operated such devices at current densities 5 times greater than this value for extended periods (approximately 1 minute) with no device damage (see, B. Oezyilmaz et al., Phys. Rev. Lett. 91, 067203 (2003)).

Method For Reading Information

The read-out magnetic layer FM3 is required in the simplest implementation of the magnetic memory device. The read-out magnetic layer FM3 has a magnetization vector $\vec{m}_3$ with a fixed magnetization direction. The magnetization vector $\vec{m}_3$ of the read-out magnetic layer FM3 can be fixed in a number of ways. For example, the read-out magnetic layer FM3 can be formed thicker or of a higher anisotropic magnetic material or can be placed adjacent to an antiferromagnetic layer to use the phenomena of exchange biasing. In the phenomena of exchange biasing, the coupling between the antiferromagnetic layer and the ferromagnetic layer and the large magnetic anisotropy of the antiferromagnetic layer results in a hardening of the ferromagnetic layer so that larger magnetic fields and currents are required to change its magnetization direction.

The resistance of the magnetic memory device is very sensitive to the relative orientation of the magnetization vector $\vec{m}_2$ of the free magnetic layer FM2 and the magnetization vector $\vec{m}_3$ of read-out magnetic layer FM3. The resistance of the magnetic memory device is highest when the magnetization vectors $\vec{m}_2$ and $\vec{m}_3$ of the free magnetic layer FM2 and the read-out layer FM3, respectively, are in anti-parallel alignment. The resistance of the magnetic device is lowest when the magnetization vectors $\vec{m}_2$ and $\vec{m}_3$ of the layers FM2 and FM3, respectively, are in parallel alignment. Thus, a simple resistance measurement can determine the orientation of the magnetization vector $\vec{m}_2$ of the free magnetic layer FM2.

The fixed orientation of the magnetization vector $\vec{m}_3$ of the read-out magnetic layer FM3 is set so that it is either in parallel or anti-parallel alignment with the magnetization vector $\vec{m}_2$ of the free magnetic layer FM2, depending on the orientation of the magnetization vector $\vec{m}_2$ of the free magnetic layer FM2. Since the orientation of the magnetization vector $\vec{m}_2$ of the free magnetic layer FM2 switches so that it can be rotated 180°, the magnetization vectors $\vec{m}_2$ and $\vec{m}_3$ of the free magnetic layer FM2 and the read-out layer FM3, respectively, must be in either anti-parallel or parallel alignment.

Storage of Multiple Bits of Information

The magnetic memory device described above and shown in FIG. 4 has two stable magnetic states and is able to store one bit of information. According to another embodiment of the present invention, a magnetic memory device can be constructed to store multiple bits of information. FIG. 6 shows an example of a free magnetic layer FM2 with four stable magnetic states. A magnetic memory device comprising a free magnetic layer FM2 with four stable magnetic states is able to store two bits of information. In this embodiment, current pulses are applied to switch the magnetization between directions that differ by 90° instead of 180°. This can be accomplished by current pulses of a different form. For example, the current pulses can be smaller in amplitude and/or shorter in duration. The readout layer (FM3) is then aligned such that each of the four magnetization states has a different resistance. This requires that the readout layer magnetization not have an in-plane component that points parallel to any of the four states nor at 45° to these states.

EXAMPLE

The operation of the magnetic device was simulated using Landau-Lifzshitz Gilbert equations including a spin-transfer torque.

Figure 8:
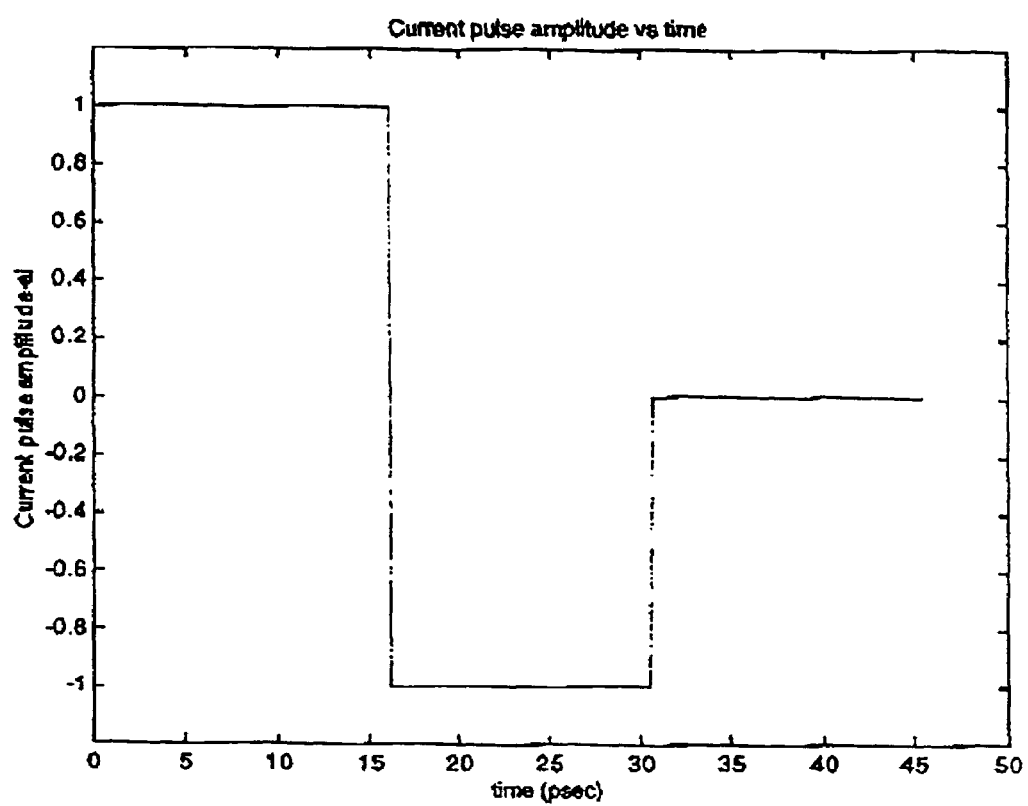
FIG. 8 is an illustration of an example of a current waveform applied to the magnetic device.

FIG. 8 shows the amplitude of the current input applied to the magnetic memory device starting at an initial time t=0 and ending at t=30 picoseconds. This current input comprises two current pulses similar to the current input shown in FIGS. 3A and 6A.

A 16-picosecond positive current pulse is applied to the magnetic memory device to start the precession of the magnetization vector $\vec{m}_2$ of the free magnetic layer FM2. After this 16-picosecond current pulse, a 14-picosecond negative current pulse is applied to the magnetic memory device to stop the precession of the magnetization vector $\vec{m}_2$ of the free magnetic layer FM2 to achieve a desired state of the magnetization vector $\vec{m}_2$. For magnetic memory devices, the precession is stopped after achieving a 180° rotation of the magnetization vector $\vec{m}_2$ of the free magnetic layer FM2.

Figure 9:
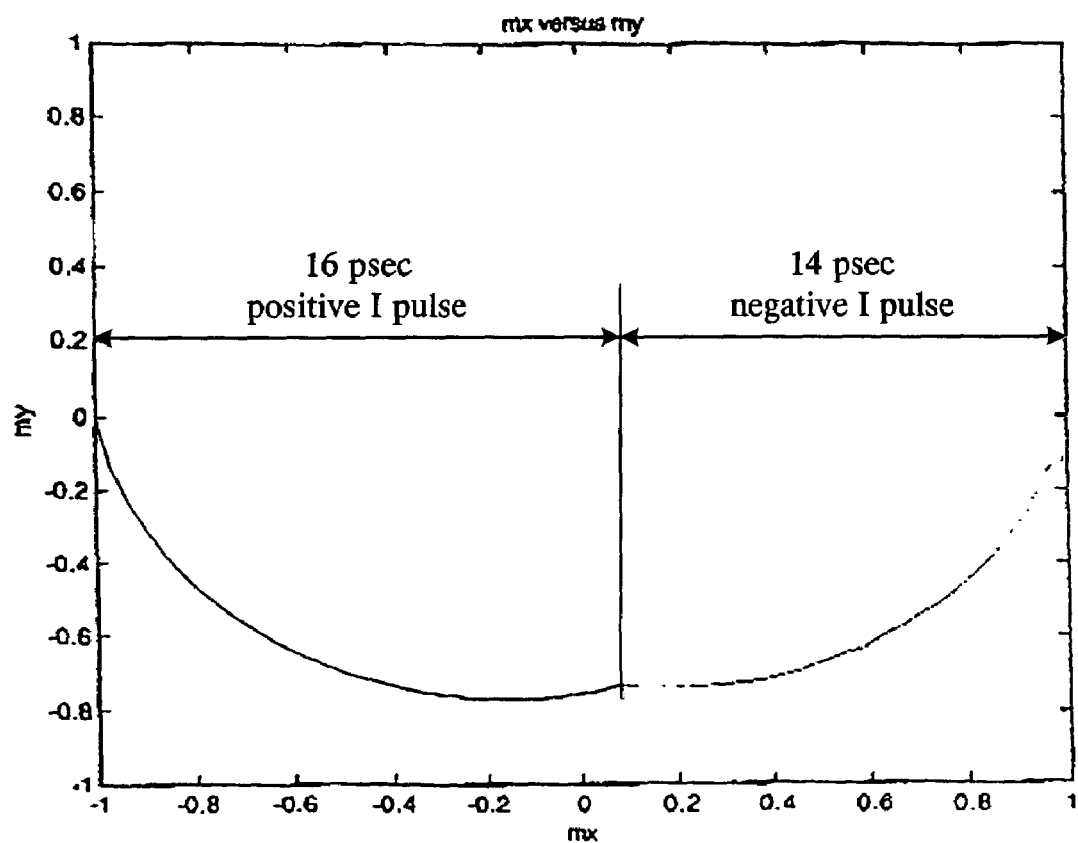
FIG. 9 is an illustration of the magnetization components of the free magnetic layer during and after the application of the current pulse shown in FIG. 8.

FIG. 9 shows the magnetization components $m_x$ and $m_y$ of the magnetization vector $\vec{m}_2$ of the free magnetic layer FM2 in the x- and y-directions shown in FIGS. 2B and 5B. The magnetization components $m_x$ and $m_y$ are measured during and after the application of the current input shown in FIG. 8. FIG. 9 shows that the magnetization vector $\vec{m}_2$ of the free magnetic layer FM2 reverses 180° from the initial state, which corresponds to FIG. 5A, to the final state, which corresponds to FIG. 5E. The magnetization components ($m_x$, $m_y$) are able to switch between (−1,0) to (1,0) as shown by the present invention.

Advantages

The high speed, low power magnetic device of the present invention uses energy only for read and write operations or logic operations. When not energized, the information is stored without significant loss. Thus, the magnetic device of the present invention, when implemented as a memory cell, can be used as a non-volatile memory.

The non-volatile memory provided by the magnetic device of the present invention is suitable for many applications, such as in computers and portable electronic devices. In particular, the high speed, low power magnetic device of the present invention provides several advantages. The performance of the high speed, low power magnetic device of the present invention compares favorably with flash memory and other types of non-volatile random access memory (RAM), such as conventional magnetic RAM (MRAM) and ferroelectric RAM (FRAM).

The current-induced torques act only on the magnetic device that is energized, i.e., to which a current is applied. Therefore, when multiple magnetic devices are arranged in an array, such as in magnetic memory, the current-induced spin transfer does not produce parasitic interactions ("crosstalk") between the neighboring elements in the array, unlike in conventional magnetic memories in which magnetic switching is accomplished by using magnetic fields produced by small current-carrying wires near the magnetic elements.

The method of magnetic switching by current induced torque provided by the present invention is faster than current conventional methods that use magnetic fields to switch the magnetization direction of layers. Read-out and write operations of the present invention can be completed in sub-nanosecond time scales. Conventional magnetic hard drives are very slow compared to the magnetic memory of the present invention since the conventional hard drives have data access times of the order of milliseconds.

The method of magnetic switching by current induced torque provided by the present invention requires low power. This is especially advantageous for use in portable electronic devices.

The method of magnetic switching by current induced torque provided by the present invention is ideal for submicron scale devices since the lateral dimension of the magnetic device of the present invention may be less than approximately 200 nm. Therefore, the present invention is scaled to allow the fabrication of ultra-high density memory cells so that a vast amount of information can be stored in the magnetic memory provided by the present invention.

The basic architecture of the high speed, low power magnetic device of the present invention is straightforward, and read-out and write operations are reliable and are less sensitive to changes in temperature. Unlike conventional magnetic memory devices, the present invention does not rely on stochastic (random) processes or fluctuating fields to initiate switching events.

According to one embodiment of the present invention, multiple bits of information can be stored on each device so that even more information can be stored in the magnetic memory.

The method of magnetic switching by current induced torque provided by the present invention can be used for logic operations, as well as for magnetic memory devices. Since there is a threshold, which is dependent on the shape, amplitude, and period of the current pulse, for the current pulse to produce a change in magnetization, current input can be combined to produce a logic function, such as an AND gate. For example, two current pulses can be combined to produce a current pulse that traverses the device which is the sum of the two current pulses. The pulse characteristics (shape, amplitude, and period) can be chosen such that each pulse individually does not switch the device, yet the combined pulse does switch the device. Thus, this is an AND operation. A NOT operation requires simply switching the state of the device. A NOT and an AND operation can be combined to produce a NAND function, which is a universal digital logic gate (i.e., all digital logic functions can be constructed from NAND gates.)

Figure 10:
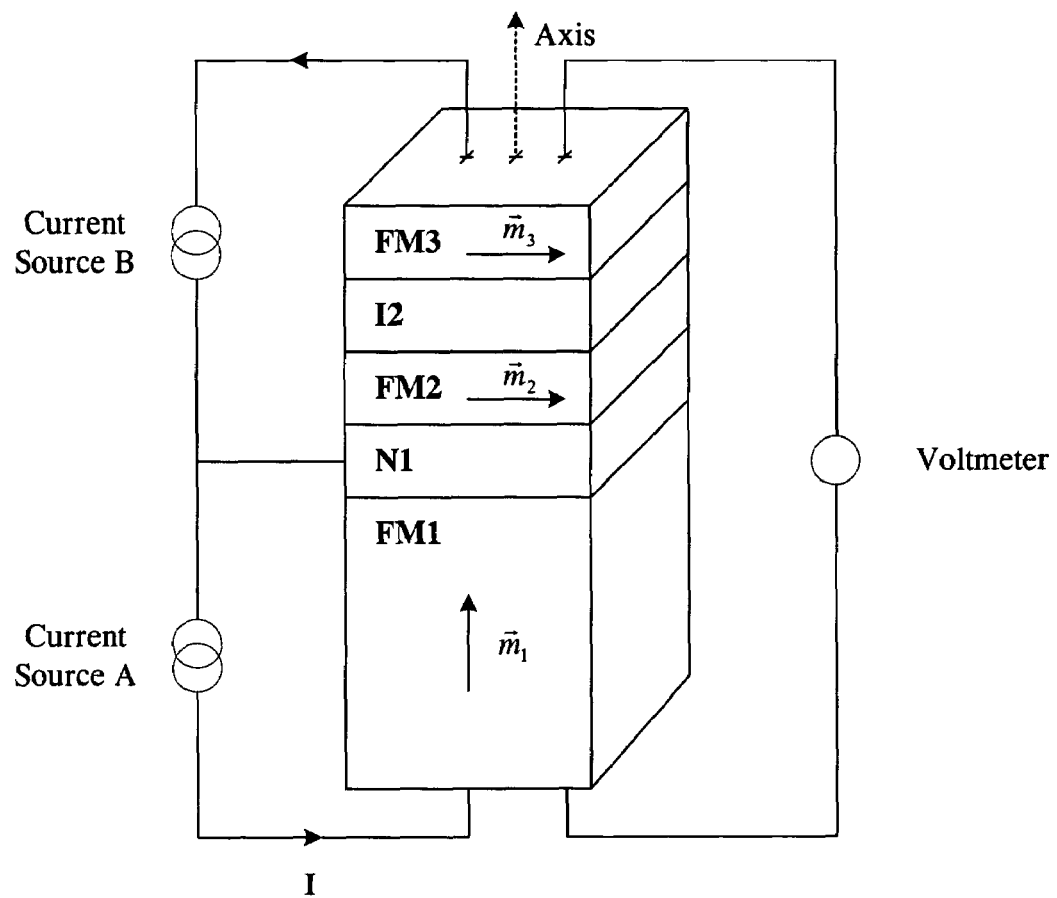
FIG. 10 is an illustration of a memory cell according to one embodiment of the present invention in which during writing operations no net current passes through the free magnetic layer.

There are several possible geometries and layer configurations that are provided by the present invention. For example, an embodiment of the magnetic device of the present invention may be configured so that no net current passes through the free magnetic layer FM2 during write operations. This is illustrated in FIG. 10 which shows an embodiment of the present invention including current source A, current source B, and layer I2, which is a thin insulating layer made of $Al_2O_3$, for example. In this device, layer I2 is 0.5 to 3 nm thick and is thin enough so that electrons can traverse the layer by quantum mechanical tunneling.

In the device shown in FIG. 10, current pulses are applied with current source A to change the magnetization direction of the free magnetic layer FM2. Using current source A, current flows from FM1 to the non-magnetic layer N1 and electron spin angular momentum is transferred to the free magnetic layer FM2 by reflection of electrons at the interface between the non-magnetic layer N1 and the free magnetic layer FM2. The device readout is performed using current source B. The voltage is measured when a small current from B passes between the free magnetic layer FM2 and the readout layer FM3. This voltage will depend on the relative magnetization directions of the layers FM2 and FM3 so that the magnetization direction of the free magnetic layer FM2 can be determined to read-out the device. This device has the advantage that the readout signal is large since the tunnel junction resistance can be large (1 Ohm to 100 kOhm). Readout signals can be in the range from 10 mV to 1 V.

While there has been described what are at present considered to be embodiments of the present invention, it will be understood that various modifications may be made thereto, and it is intended that the appended claims cover all such modifications as fall within the true spirit and scope of the invention.

We claim:

1. A magnetic device comprising:
   a pinned magnetic layer with a magnetization vector with a fixed magnetization direction;
   a free magnetic layer with at least one magnetization vector with a changeable magnetization direction;
   a first non-magnetic layer spatially separating said free magnetic layer and said pinned magnetic layer;
   a read-out magnetic layer with a magnetization vector with a fixed magnetization direction; and
   a second non-magnetic layer that spatially separates said free magnetic layer and said read-out magnetic layer such that the mutual magnetic interaction between said free magnetic layer and said read-out magnetic layer is minimized.

2. The magnetic device according to claim 1, wherein one of said magnetization directions of said pinned magnetic layer, said free magnetic layer, and said read-out magnetic layer lies along an axis which is different than at least one of axes along which said other magnetization directions lie.

3. The magnetic device according to claim 1, wherein:
   said fixed magnetization direction of said pinned magnetic layer is perpendicular to a plane of said free magnetic layer; and
   said changeable magnetization direction of said free magnetic layer is perpendicular to an axis extending longitudinally through said magnetic device.

4. The magnetic device according to claim 1, wherein said changeable magnetization direction of said free magnetic layer and said fixed magnetization direction of said read-out layer switch between being in anti-parallel alignment and parallel alignment.

5. The magnetic device according to claim 1, wherein said free magnetic layer has a single magnetization vector with a changeable magnetization vector.

6. The magnetic device according to claim 1, wherein said magnetization direction of said magnetization vector of said free magnetic layer represents a bit of information.

7. The magnetic device according to claim 1, wherein:
   said magnetic device is pillar-shaped; and
   said pinned magnetic layer, said first non-magnetic layer, said free magnetic layer, said second magnetic layer, and said read-out magnetic layer are less than approximately 200 nm laterally and approximately 1 nm to 50 nm thick.

8. The magnetic device according to claim 1, wherein said pinned magnetic layer, said free magnetic layer, and said read-out magnetic layer are comprised of a member of the group consisting of Co, Ni, Fe, an alloy of Co and Ni, an alloy of Co and Fe, an alloy of Ni and Fe, an alloy of Co, Ni, and Fe, and permalloy Ni1-xFex.

9. The magnetic device according to claim 1, wherein said pinned magnetic layer, said free magnetic layer, and said read-out magnetic layer are comprised of a non-magnetic metal and a member of the group consisting of an alloy of Co and Ni, an alloy of Co and Fe, an alloy of Ni and Fe, an alloy of Co, Ni, and Fe, such that said non-magnetic metal and said member are ferromagnetically ordered at room temperature.

10. The magnetic device according to claim 9, wherein said non-magnetic metal is a member of the group consisting of Cu, Pd, and Pt.

11. The magnetic device according to claim 1, wherein said pinned magnetic layer, said free magnetic layer, and said read-out magnetic layer are comprised of a member of the group consisting of NiMnSb and a conducting magnetic oxide.

12. The magnetic device according to claim 11, wherein said conducting magnetic oxide is either CrO2 or Fe3O4.

13. The magnetic device according to claim 1, wherein said non-magnetic layers are comprised of at least one member of the group consisting of Cu, Cr, Au, Ag, and Al.

14. A memory system comprising:
a memory cell comprising:
a pinned magnetic layer with a magnetization vector with a fixed magnetization direction;
a free magnetic layer with at least one magnetization vector with a changeable magnetization direction;
a first non-magnetic layer spatially separating said free magnetic layer and said pinned magnetic layer;
a read-out magnetic layer with a magnetization vector with a fixed magnetization direction; and
a second non-magnetic layer that spatially separates said free magnetic layer and said read-out magnetic layer such that the mutual magnetic interaction between said free magnetic layer and said read-out magnetic layer is minimized; and
an electric current source connected to said pinned magnetic layer and said read-out magnetic layer so that an electric current can traverse said memory cell.

15. The memory system according to claim 14, wherein one of said magnetization directions of said pinned magnetic layer, said free magnetic layer, and said read-out magnetic layer lies along an axis which is different than at least one of axes along which said other magnetization directions lie.

16. The memory system according to claim 14, further comprising a means for measuring the resistance between said pinned magnetic layer and said read-out magnetic layer.

17. The memory system according to claim 16, wherein said resistance measuring means comprises a voltmeter connected to said pinned magnetic layer and said read-out magnetic layer.

18. The memory system according to claim 14, wherein said electric current comprises a single current pulse.

19. The memory system according to claim 14, wherein said electric current comprises two current pulses wherein one of said two current pulses is a negative current pulse and the other of said two current pulses is a positive current pulse.

20. The memory system according to claim 14, wherein said electric current is applied in a sub-nanosecond period of time.

21. A method of magnetic switching using current-induced spin-momentum transfer, said method comprising the steps of:
applying an electric current to a magnetic device, wherein said electric current comprises two current pulses wherein one of said two current pulses is a negative current pulse and the other of said two current pulses is a positive current pulse, wherein said current applying step occurs in a sub-nanosecond period of time; and
stopping said electric current when a magnetization vector of said magnetic device has rotated 180° while said electric current is applied.

22. A method of making a memory cell, said method comprising the steps of:
forming a first non-magnetic layer on a pinned magnetic layer, said pinned magnetic layer having a magnetization vector with a fixed magnetization direction;
forming a free magnetic layer with at least one magnetization vector with a changeable magnetization direction on said first non-magnetic layer;
forming a second non-magnetic layer on said free magnetic layer; and
forming a read-out magnetic layer with a magnetization vector with a fixed magnetization direction on said second non-magnetic layer.

23. The method of making a memory cell according to claim 22, wherein one of said magnetization directions of said pinned magnetic layer, said free magnetic layer, and said read-out magnetic layer lies along an axis which is different than at least one of axes along which said other magnetization directions lie.

24. The method of making a memory cell according to claim 22, further comprising the step of:
connecting an electric current source to said pinned magnetic layer and said read-out magnetic layer so that an electric current can traverse said memory cell.

25. The method of making a memory cell according to claim 22, further comprising the step of:
measuring the resistance between said pinned magnetic layer and said read-out magnetic layer.

26. The method of making a memory cell according to claim 25, wherein said resistance measuring step comprises the step of connecting a voltmeter to said pinned magnetic layer and said read-out magnetic layer.

27. The method of making a memory cell according to claim 22, wherein said pinned magnetic layer, said free magnetic layer, and said read-out magnetic layer are comprised of a member of the group consisting of Co, Ni, Fe, an alloy of Co and Ni, an alloy of Co and Fe, an alloy of Ni and Fe, an alloy of Co, Ni, and Fe, and a permalloy Ni1-xFex.

28. The method of making a memory cell according to claim 22, wherein said pinned magnetic layer, said free magnetic layer, and said read-out magnetic layer are comprised of a non-magnetic metal and a member of the group consisting of an alloy of Co and Ni, an alloy of Co and Fe, an alloy of Ni and Fe, an alloy of Co, Ni, and Fe, such that said non-magnetic metal and said member are ferromagnetically ordered at room temperature.

29. The method of making a memory cell according to claim 28, wherein said non-magnetic metal is a member of the group consisting of Cu, Pd, and Pt.

30. The method of making a memory cell according to claim 22, wherein said pinned magnetic layer, said free magnetic layer, and said read-out magnetic layer are comprised of a member of the group consisting of NiMnSb and a conducting magnetic oxide.

31. The method of making a memory cell according to claim 30, wherein said conducting magnetic oxide is either CrO2 or Fe3O4.

32. The method of making a memory cell according to claim 22, wherein said non-magnetic layers are comprised of at least one member of the group consisting of Cu, Cr, Au, Ag, and Al.

33. The magnetic device according to claim 1, wherein the mutual magnetic interaction between said free magnetic layer and said pinned magnetic layer is minimized.

34. The memory system according to claim 14, wherein the mutual magnetic interaction between said free magnetic layer and said pinned magnetic layer is minimized.

35. The method of making a memory cell according to claim 22, wherein said first and said second non-magnetic layers minimize the mutual magnetic interaction between said pinned magnetic layer, said free magnetic layer, and said read-out magnetic layer.

* * * * *

UNITED STATES PATENT AND TRADEMARK OFFICE
CERTIFICATE OF CORRECTION

PATENT NO. : 6,980,469 B2  
APPLICATION NO. : 10/643762  
DATED : December 27, 2005  
INVENTOR(S) : Andrew Kent et al.

Page 1 of 1

It is certified that error appears in the above-identified patent and that said Letters Patent is hereby corrected as shown below:

Column 1,  
Line 5, insert:  
-- This invention was made with government support under Contract Number NSF-FRG-DMS-0201439 entitled "Analysis and Simulation of Magnetic Devices" awarded by the National Science Foundation, and Contract Number ONR N0014-02-1-0995 entitled "Gate Controlled Ferromagnetism in Semiconductor Nanostructures" awarded by the Office of Naval Research of the Department of Defense. The government has certian rights in the invention. --.

Signed and Sealed this

Eleventh Day of July, 2006

JON W. DUDAS  
*Director of the United States Patent and Trademark Office*